(12) United States Patent
Endo et al.

(10) Patent No.: US 7,998,663 B2
(45) Date of Patent: *Aug. 16, 2011

(54) PATTERN FORMATION METHOD

(75) Inventors: Masayuki Endo, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/212,291

(22) Filed: Sep. 17, 2008

(65) Prior Publication Data

US 2009/0092930 A1     Apr. 9, 2009

(30) Foreign Application Priority Data

Oct. 4, 2007 (JP) ................................. 2007-261036

(51) Int. Cl.
  *G03F 7/207* (2006.01)
(52) U.S. Cl. .......................... 430/323; 430/394; 430/322
(58) Field of Classification Search .................... None
  See application file for complete search history.

(56) References Cited

U.S. PATENT DOCUMENTS

| 6,140,225 A | 10/2000 | Usami et al. | |
|---|---|---|---|
| 6,569,595 B1 * | 5/2003 | Sato et al. | 430/270.1 |
| 2006/0041047 A1 * | 2/2006 | Ramsey | 524/430 |
| 2006/0078823 A1 | 4/2006 | Kanda et al. | |
| 2007/0105054 A1 | 5/2007 | Chiba et al. | |
| 2007/0141273 A1 | 6/2007 | Nakano | |
| 2007/0148602 A1 | 6/2007 | Lee et al. | |
| 2007/0161245 A1 * | 7/2007 | Rathsack et al. | 438/689 |
| 2008/0032239 A1 * | 2/2008 | Endo et al. | 430/324 |
| 2008/0138597 A1 * | 6/2008 | Asai | 428/220 |
| 2008/0193882 A1 * | 8/2008 | Endo et al. | 430/323 |
| 2008/0227038 A1 * | 9/2008 | Endo et al. | 430/324 |

OTHER PUBLICATIONS

Maenhoudt, M., et al., "Double Patterning scheme for sub-0.25 kl single damascene structures at NA=0.75, λ=193nm", Optical Microlithography XVIII Proceedings of SPIE, 2005, pp. 1508-1518, vol. 5754, Bellingham, WA USA.

* cited by examiner

*Primary Examiner* — Daborah Chacko Davis

(74) *Attorney, Agent, or Firm* — McDermott Will & Emery LLP

(57) ABSTRACT

After forming an underlying layer film and an intermediate layer film are formed over a substrate, a resist pattern formed by first pattern exposure using a first resist film and second pattern exposure using a second resist film is transferred onto the intermediate layer film. Furthermore, the underlying layer film is etched using the intermediate layer pattern as a mask, thereby obtaining an underlying layer film pattern. The underlying layer film includes as an adduct a fluorine-based surfactant or inorganic nano particles and is provided with a resistance against oxygen-based plasma.

18 Claims, 10 Drawing Sheets

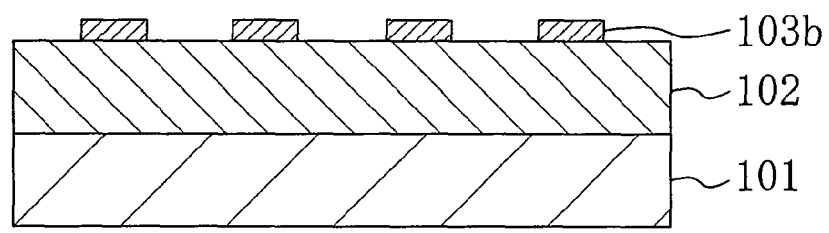
FIG. 4A
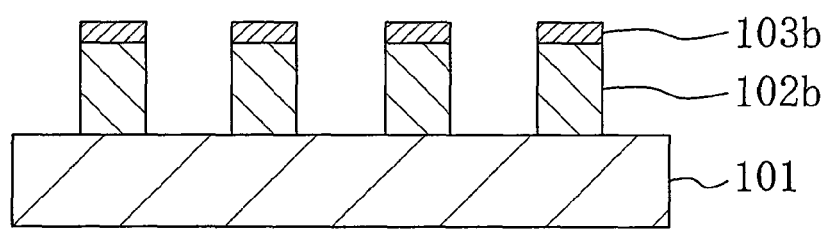
FIG. 4B
FIG. 5
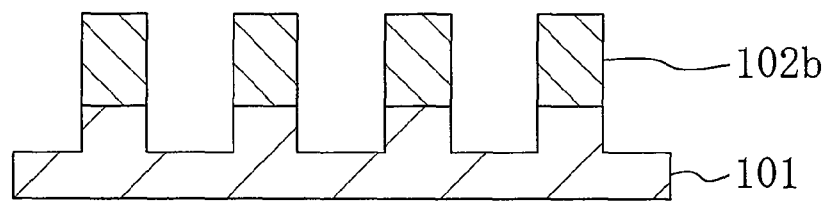

PATTERN FORMATION METHOD

BACKGROUND OF THE INVENTION

1. Field of the Invention

The present invention relates to a pattern formation method for use in fabrication process or the like for semiconductor devices, and more particularly relates to a pattern formation method using double patterning.

2. Description of the Prior Art

With increase in degree of integration of semiconductor devices and reduction in size of semiconductor devices, there have been increased demands for further rapid development of lithography techniques. Currently, pattern formation is performed by photolithography using, as a light source, a mercury lamp, KrF excimer laser, ArF excimer laser or the like. Furthermore, use of $F_2$ laser with a further shorter wavelength was examined. However, there remain problems of exposure systems and resist materials and thus the development of lithography using $F_2$ laser is discontinued.

Under such circumstances, in order to further reduce pattern size in light exposure using light with an exposure wavelength according to a known technique, a method called double patterning has been proposed (for example, see M. Maenhoudt, et al., "Double Patterning scheme for sub-0.25 kl single damascene structures at NA=0.75, λ=193 nm", Proc. SPIE, vol. 5754, 1508 (2005)). This is a method in which a desired mask pattern is divided into two separate photomasks and exposure is performed using the two masks, thereby improving pattern contrast.

Resolution in lithography is defined as $k_1 \cdot \lambda / NA$ ($k_1$: process constant, λ: exposure wavelength, NA: numerical aperture of exposure tool). In double patterning, the improvement of pattern contrast results in large reduction in a $k_1$ value. Accordingly, even when light at the same exposure wavelength is used, the resolution can be largely improved.

Hereafter, a known pattern formation method using double patterning will be described with reference to FIGS. 8A through 8D, FIGS. 9A through 9D and FIGS. 10A and 10B.

First, as shown in FIG. 8A, a hard mask (for example, a silicon nitride film) 202 is formed on a semiconductor substrate 201 so as to have a thickness of about 0.12 μm.

Next, as shown in FIG. 8B, a first ArF resist film 203 is formed on the hard mask 202 so as to have a thickness of about 0.15 μm. Thereafter, first exposure is performed through a first photomask 204 using ArF excimer laser light 205 with NA of 0.85. After the first exposure, the first ArF resist film 203 is heated with a hot plate at a temperature of about 105° C. for about 60 seconds.

Next, as shown in FIG. 8C, the first ArF resist film 203 is developed using a 2.38 wt % tetramethylammonium hydroxide developer fluid, thereby forming a first resist pattern 203a.

Next, as shown in FIG. 8D, using the first resist pattern 203a as a mask, etching is performed using fluorine-based gas or the like, thereby forming a first hard mask pattern 202a.

Next, as shown in FIG. 9A, the first resist pattern 203a is removed by ashing using oxygen plasma and then, as shown in FIG. 9B, a second ArF resist film 206 is formed on the first hard mask pattern 202a so as to have a thickness of about 0.15 μm.

Next, as shown in FIG. 9C, second exposure is performed through a second photomask 207 using ArF excimer laser light 205 with NA of 0.85. After the second exposure, the second ArF resist film 206 is heated by a hot plate at a temperature of about 105° C. for about 60 seconds.

Next, as shown in FIG. 9D, the second ArF resist film 206 is developed using a 2.38 wt % tetramethylammonium hydroxide developer fluid, thereby forming a second resist pattern 206a.

Next, as shown in FIG. 10A, using the second resist pattern 206a as a mask, the hard mask 202 is etched with fluorine-based gas or the like. Thereafter, as shown in FIG. 10B, the second resist pattern 206a is removed by ashing using oxygen plasma, thereby obtaining a second hard mask pattern 202b.

Thus, the fine second hard mask pattern 202b can be obtained by two separate pattern exposures and two separate etchings using hard masks. For example, as shown in FIG. 11, by performing dry etching to the semiconductor substrate 201 (or etching target film (not shown) formed on the semiconductor substrate 201) using the second hard mask pattern 202b formed by double patterning, the semiconductor substrate 201 (or the etching target film) can be fine-processed.

SUMMARY OF THE INVENTION

In the above-described double patterning, if a surface of the first hard mask pattern 202a as an underlying layer is very rough when the second ArF resist film 206 is applied onto the first hard mask pattern 202a for the second time, film application properties might be degraded. In that case, a resolution in the second pattern exposure is reduced and, as a result, even though double patterning is adopted, a sufficient resolution can not be achieved.

To cope with this problem, the present inventors have proposed a method in which an underlying layer film is provided under a hard mask (an intermediate layer film) and, after transferring a resist pattern formed by second pattern exposure onto the intermediate layer film and thereby forming an intermediate layer pattern, a predetermined pattern (an underlying layer film pattern) is formed by transferring the intermediate layer pattern onto the underlying layer film (see Japanese Patent Application No. 2007-248783). According to this method, the intermediate layer film can be formed so as to have a smaller thickness than that of a known hard mask, so that in second pattern exposure, reduction in resolution due to degradation of resist application properties can be suppressed.

However, the present inventors have found, during examination of pattern formation using double patterning in a structure in which an underlying layer film is provided under an intermediate layer film, that there still remain the following problems. Hereafter, the problems will be described with reference to FIGS. 12A through 12D.

FIG. 12A, FIG. 12B and FIG. 12C correspond to FIG. 8D, FIG. 10A and FIG. 10B, respectively, and this structure is different from a structure according to a known technique in that an underlying layer film 210 is further provided under a hard mask (intermediate layer film) 202.

FIG. 12A is a cross-sectional view illustrating the step of removing a first resist pattern 203a formed by first pattern exposure by ashing using oxygen plasma 220. A surface 230a of the underlying layer film 210 is exposed to the oxygen plasma 220.

FIG. 12B is a cross-sectional view illustrating the step of etching the intermediate layer film 202 using as a mask a second resist pattern 206a formed by second pattern exposure to form an intermediate layer pattern 202b and then removing the second resist pattern 206a by ashing using oxygen plasma 220. A surface 230b of the underlying layer film 210 is exposed to the oxygen plasma 220.

When the second resist pattern 206a is removed by ashing, over-ashing is always caused. Thus, as shown in FIG. 12C, in addition to exposure to oxygen plasma 220 when the first resist pattern 203a is removed by ashing, the surface 230a of the underlying layer film 210 is exposed to the oxygen plasma 220 again for the second time.

With this state, as shown in FIG. 12D, in order to transfer the intermediate layer pattern 202b on the underlying layer film 210, when the underlying layer film 210 is etched using the intermediate layer pattern 202b as a mask to form an underlying layer film pattern 210b, the following problems occur.

Specifically, between the surface 230a and the surface 230b of the underlying layer film 210 which are not covered by the intermediate layer pattern 202b, the amount of exposure to oxygen plasma differs and, accordingly, the surface condition varies. Therefore, when the underlying layer film 210 is etched, a difference in etching rate is caused and, as a result, as shown in FIG. 12D, variation in dimension might be generated between spaces A and B in a lower layer film pattern 210b. Also, between the surface 230a and the surface 230b of the underlying layer film 210, the amount of side etch due to over-ashing also differs and, accordingly, the dimension shift amount might differ between the spaces A and B in the lower layer film pattern 210b. In addition, as shown in FIG. 12A, when the second resist film 206 (not shown) is applied onto the intermediate layer pattern 202a after the first resist pattern 203a is removed, variation in thickness of the second resist film 206 might be caused by damages on the surface 230a of the lower layer film 210 due to the oxygen plasma 220 although there is no direct relationship with the difference in exposure amount by oxygen plasma. As a result, in the second pattern exposure, variation in dimension might be generated in the second resist pattern 206a.

As has been described, the generation of variation in pattern dimension and the like due to a difference in the amount of exposure to oxygen plasma between the surface 230a and the surface 230b of the underlying layer film 210 (and also due to damages on the surface 230a of the underlying layer film 210 by oxygen plasma) are considered as unique problems that are not avoidable in double patterning in a structure in which the underlying layer film 210 is provided under the intermediate layer film 202.

The present invention has been devised on the basis of the above-described findings, and it is therefore a main object to solve the above-described unique problems to double patterning and to provide a pattern formation method with which a fine pattern with a small dimension variation can be achieved.

To achieve the above-described object, in a pattern formation method according to the present invention, in double patterning in a structure in which an underlying layer film is provided under an intermediate layer film, the underlying layer film is formed of an organic material with a resistance to oxygen-based plasma. With an oxygen-based plasma resistance given to the underlying layer film, influences by a difference in amount of exposure to oxygen plasma applied to a surface of the underlying layer film and the like on etching of the underlying layer film which is to be performed later can be reduced. Thus, a fine pattern with a small dimension variation can be formed.

To give oxygen-based plasma resistance to the underlying layer film of an organic material, specifically, a method in which a fluorine-based surfactant is added to the underlying layer film or a method in which inorganic nano particles are added to the underlying layer film can be adopted. Note that since the surface free energy of fluorine is low (see Koh Meiten, et al., Application of fluorine resin to resist material for use in semiconductor, The Chemical Times, No. 3, P. 6 (2003)), a fluorine-based surfactant tends to locally concentrate around a surface of the underlying layer film. Thus, there is no such a problem that etching of the underlying layer film (formation of a lower layer film pattern) is inhibited. Also, inorganic nano particles (with a diameter of about several nm) do not inhibit etching of the underlying layer film (formation of a lower layer film pattern) as long as the inorganic nano particles are dispersed in the underlying layer film. In this case, it is preferable that 10 to 30 wt % of a fluorine-based surfactant is added to the underlying layer film. It is also preferable that 5 to 20 wt % of inorganic nano particles are added to the underlying layer film.

A pattern formation method according to the present invention is characterized in that the method includes the steps of: a) forming an underlying layer film on a substrate; b) forming an intermediate layer film on the underlying layer film; c) forming a first resist film on the intermediate layer film and then performing exposure and development to the first resist film through a first photomask having a first pattern, thereby forming a first resist pattern; d) etching the intermediate film using the first resist pattern as a mask, thereby forming a first intermediate layer pattern; e) removing the first resist film; f) forming, after the step e), a second resist film on the underlying layer film and the first intermediate layer pattern, and then performing exposure and development to the second resist film through a second photomask having a second pattern, thereby forming a second resist pattern; g) etching the intermediate layer film using the second resist pattern as a mask, thereby forming a second intermediate layer pattern; h) removing the second resist film; and i) etching, after the step h), the underlying layer film using the second intermediate layer pattern as a mask, thereby forming an underlying layer film pattern including the first and second patterns, the underlying layer film is formed of an organic material having a resistance against oxygen-based plasma, and in the step e), the first resist film is removed by ashing with oxygen-based plasma.

In the inventive method, in at least one of the step c) and the step f), immersion exposure may be performed with a solution provided on the first resist film or the second resist film. Furthermore, the inventive method may further include, before performing the immersion exposure, the step of forming a barrier film on the first resist film or the second resist film.

According to the pattern formation method, variation in pattern dimension and the like, which are unique to double patterning, due to a difference in the amount of exposure to oxygen plasma applied to a surface of the underlying layer film can be effectively prevented. Thus, a fine pattern can be formed with high dimensional accuracy.

BRIEF DESCRIPTION OF THE DRAWINGS

FIGS. 4A and 4B are cross-sectional views illustrating respective steps of a pattern formation method according to the first embodiment of the present invention.

FIG. 5 is a cross-sectional view illustrating a step of etching a semiconductor substrate using a pattern formed by a pattern formation method according to the first embodiment of the present invention.

FIG. 6A is a cross-sectional view illustrating a step of immersion exposure in a first pattern exposure. FIG. 6B is a cross-sectional view illustrating a step of immersion exposure in a second pattern exposure.

FIG. 7A is a cross-sectional view illustrating a step of forming a barrier film before a first pattern exposure. FIG. 7B is a cross-sectional view illustrating a step of forming a barrier film before a second pattern exposure.

DESCRIPTION OF THE PREFERRED EMBODIMENTS

Figure 1A:
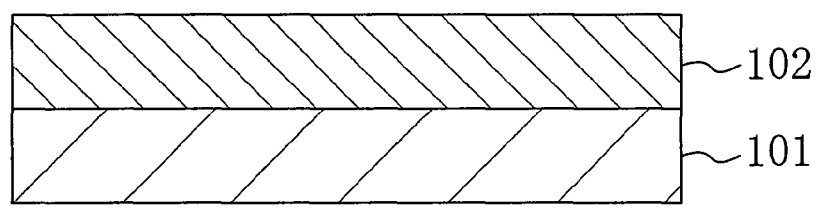
FIGS. 1A through 1C are cross-sectional views illustrating respective steps of a pattern formation method according to a first embodiment of the present invention.

Hereafter, embodiments of the present invention will be described with reference to the accompanying drawings. In the following drawings, each component having substantially the same function is identified by the same reference numeral for simplification of description. Note that the present invention is not limited to the following embodiments.

First Embodiment

A pattern formation method according to a first embodiment of the present invention will be described with reference to FIGS. 1A through 1C, FIGS. 2A through 2D, FIGS. 3A through 3D and FIGS. 4A and 4B.

First, as shown in FIG. 1A, an underlying layer film 102 is formed on a semiconductor substrate 101 so as to have a thickness of about 0.7 μm. In this embodiment, the underlying layer film 102 is formed of an organic film. For example, an organic material obtained by hardening a substance having a hydrocarbon backbone by thermal cross-linking or the like can be used for the underlying layer film 102. Moreover, 15 wt % perfluoroalkyl group-containing sulfonate (fluorine-based surfactant) is added to the underlying layer film 102.

Figure 1B:
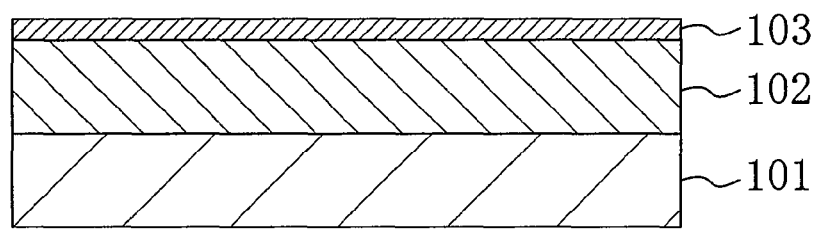

Next, as shown in FIG. 1B, an intermediate layer film 103 is formed on the underlying layer film 102 so as to have a thickness of about 0.08 μm. The intermediate layer film 103 functions as a hard mask. In this embodiment, for example, a material containing silicon having a $SiO_2$ backbone, a SiN backbone, a SiON backbone or the like can be used for the intermediate layer film 103.

Figure 1C:
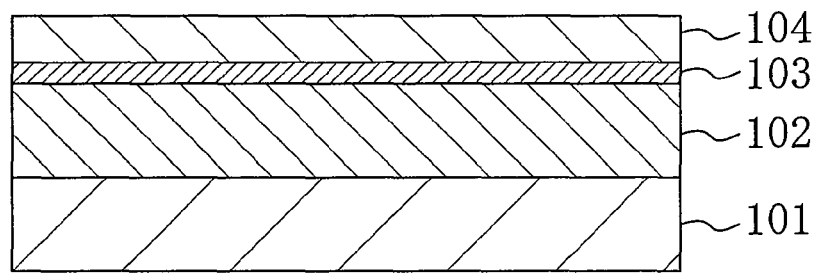

Next, as shown in FIG. 1C, a first resist film 104 is formed on the intermediate layer film 103 so as to have a thickness of about 0.15 μm. In this embodiment, for example, a chemically amplified resist for ArF excimer laser can be used as the first resist film 104.

Figure 2A:
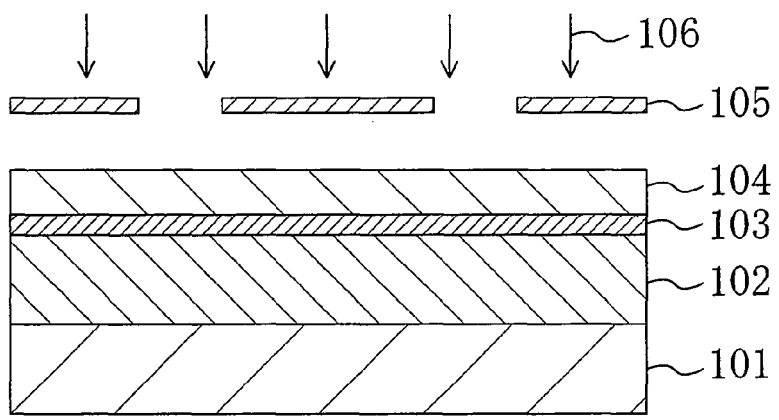
FIGS. 2A through 2D are cross-sectional views illustrating respective steps of a pattern formation method according to the first embodiment of the present invention.

Next, as shown in FIG. 2A, first pattern exposure is performed by irradiating the substrate with ArF excimer laser light 106 having NA of 0.85 through a first photomask 105 having a first pattern. After the first exposure, the first resist film 104 is heated with a hot plate at a temperature of 105° C. for 60 seconds (post exposure baking).

Figure 2B:
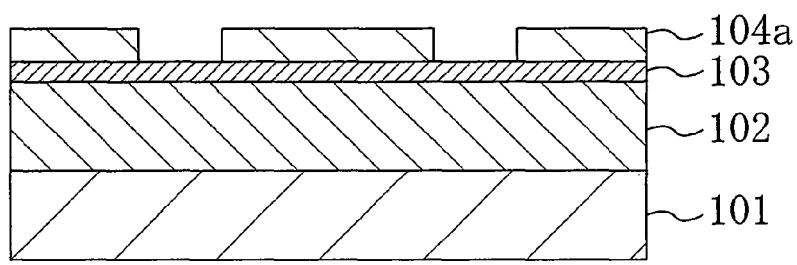

Next, as shown in FIG. 2B, the baked first resist film 104 is developed using a 2.38 wt % tetramethylammonium hydroxide aqueous solution (alkaline developer fluid), thereby forming a first resist pattern 104a of unexposed part of the first resist film 104.

Figure 2C:
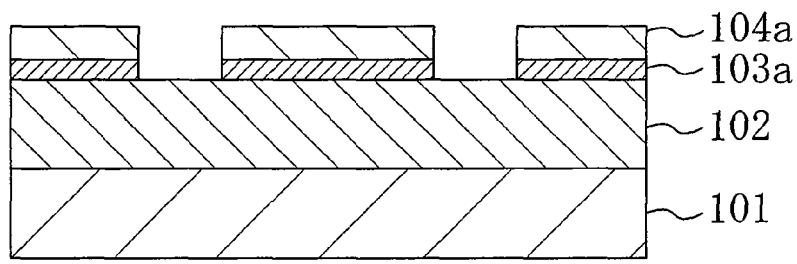
Figure 2D:
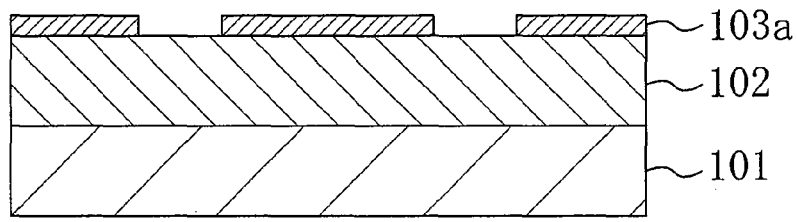

Next, as shown in FIG. 2C, using the first resist pattern 104a as a mask, the intermediate layer film 103 is etched, for example, with fluorine-based gas, and then, as shown in FIG. 2D, the first resist pattern 104a is removed by ashing using oxygen plasma, thereby forming a first intermediate layer pattern 103a.

In this embodiment, the underlying layer film 102 to which the fluorine-based surfactant is added is provided with oxygen-based plasma resistance. Thus, even when a surface of the underlying layer film 102 is exposed to oxygen plasma, damages and the like are not given to the underlying layer film 102.

Figure 3A:
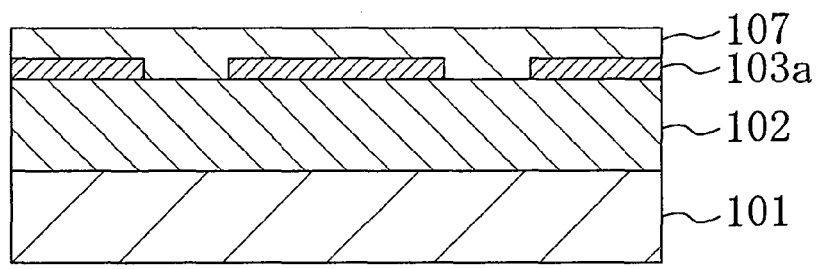
FIGS. 3A through 3D are cross-sectional views illustrating respective steps of a pattern formation method according to the first embodiment of the present invention.

Next, as shown in FIG. 3A, a second resist film 107 is formed on the first intermediate layer pattern 103a so as to have a thickness of about 0.15 μm. In this embodiment, the same material as that of the first resist film 104 can be used for the second resist film 107.

Figure 3B:
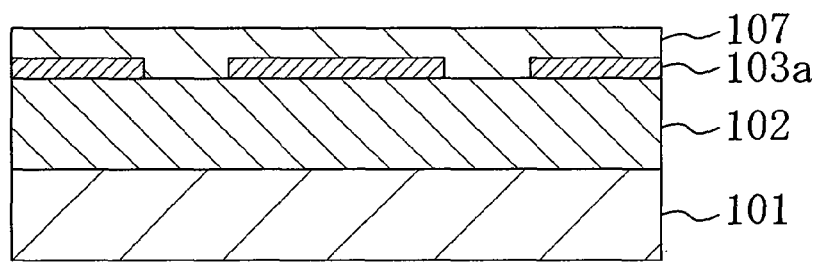

Next, as shown in FIG. 3B, second pattern exposure is performed by irradiating the substrate with the ArF excimer laser light 106 having NA of 0.85 through a second photomask 108 having a second pattern. After the second exposure, the second resist film 107 is heated with a hot plate at a temperature of 105° C. for 60 seconds (post exposure baking).

Figure 3C:
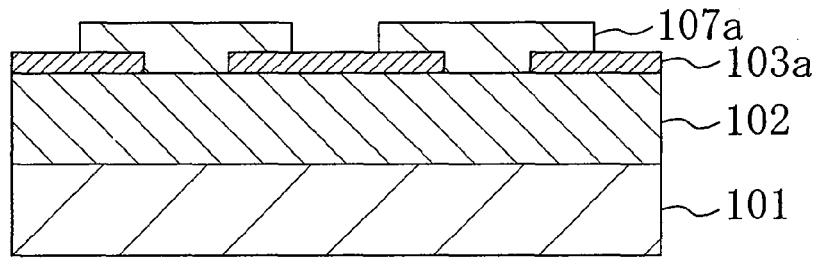

Next, as shown in FIG. 3C, the baked second resist film 107 is developed using a 2.38 wt % tetramethylammonium hydroxide aqueous solution (alkaline developer fluid), thereby forming a second resist pattern 107a of unexposed part of the second resist film 107.

Figure 3D:
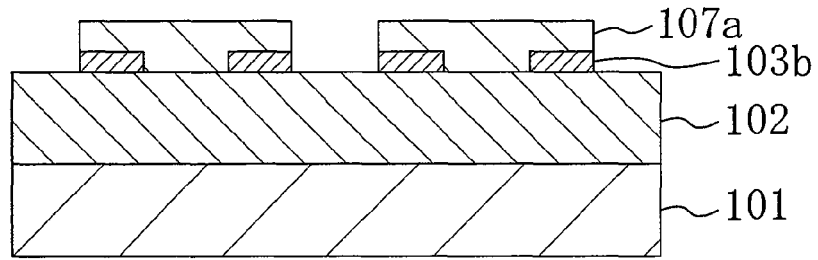

Next, as shown in FIG. 3D, using the second resist pattern 107a as a mask, the first intermediate layer pattern 103a is etched, for example, with fluorine-based gas, and then, as shown in FIG. 4A, the second resist pattern 107a is removed by ashing using oxygen plasma, thereby forming a second intermediate layer pattern 103b.

Also, in this process step, a surface of the underlying layer film 102 is exposed to oxygen plasma but, since the underlying layer film 102 is provided with a resistance against oxygen-based plasma, damages and the like are not given to the underlying layer film 102.

Lastly, as shown in FIG. 4B, using the second intermediate layer pattern 103b as a mask, the underlying layer film 102 is etched with oxygen-based gas, thereby forming a lower layer film pattern 102b having the first and the second patterns.

In the pattern formation method of this embodiment, part of the surface of the underlying layer film 102 on which the second intermediate layer pattern 103b is not formed is exposed to oxygen plasma when the first resist pattern 104a and the second resist pattern 107a formed by the two pattern exposure processes are removed by ashing. However, the underlying layer film 102 is provided with a resistance against oxygen-based plasma due to addition of a fluorine surfactant thereto and thus, even when the underlying layer film 102 is etched using the second intermediate layer pattern 103b as a mask, problems such as variation in pattern dimension, shift of pattern dimension and the like do not arise. Moreover, because a fluorine surfactant tends to be unevenly distributed so as to concentrates around a surface of the underlying layer film 102, etching of the underlying layer film 102 is not inhibited and the lower layer film pattern 102b can be formed so as to have a good shape.

The additive amount of a fluorine-based surfactant contained in the underlying layer film 102 is preferably in a range of 10 to 30 wt %. If the additive amount is smaller than 10 wt %, sufficient resistance against oxygen-based plasma can not be achieved. If the additive amount is larger than 30 wt %, etching of the underlying layer film 102 might be inhibited.

As a fluorine-based surfactant, for example, an anionic fluorine-based or nonionic fluorine-based surfactant can be used. However, a surfactant used according to the present invention is not limited thereto. Moreover, besides perfluoroalkyl group-containing sulfonate used in this embodiment, one of perfluoroalkyl group-containing carboxylate, perfluoroalkyl group-containing ester phosphate and the like, or combination of two or more of the above-described materials can be used as an anionic fluorine-based surfactant. As a nonionic fluorine-based surfactant, perfluoroalkyl ethylene oxide adduct or the like can be used.

A technique for adding a fluorine-based surfactant to a chemically amplified resist is described in Japanese Laid-Open Publication No. 2006-133712. This is one of immersion exposure techniques in which in order to increase a resolution, a surface of resist is hydrophobized to improve a contact angle between the resist and an immersion liquid. This is a totally different technique from the technique for adding a fluorine-based surfactant to the underlying layer film 102 according to the present invention, and an object, a structure and effects of the inventive technique are different from those of the known technique.

FIG. 5 is a cross-sectional view illustrating a step of etching the semiconductor substrate 101 (or an etching target film (not shown) formed on the semiconductor substrate 101) using the lower layer film pattern 102b formed according to this embodiment. By using the fine lower layer film pattern 102b having a good shape, the semiconductor substrate 101 (or an etching target film) can be finely processed as the good shape of the semiconductor substrate 101 is maintained.

As a matter of course, the lower layer film pattern 102b formed according to the present invention can be used as not only a mask for use in dry etching but also a mask (for example, a mask for ion implantation or the like) for use in various process steps in fabrication process for semiconductor devices.

Modified Example of First Embodiment

Resolution in double patterning can be further improved by applying the immersion exposure technique to the pattern formation method of the present invention.

Figure 6A:
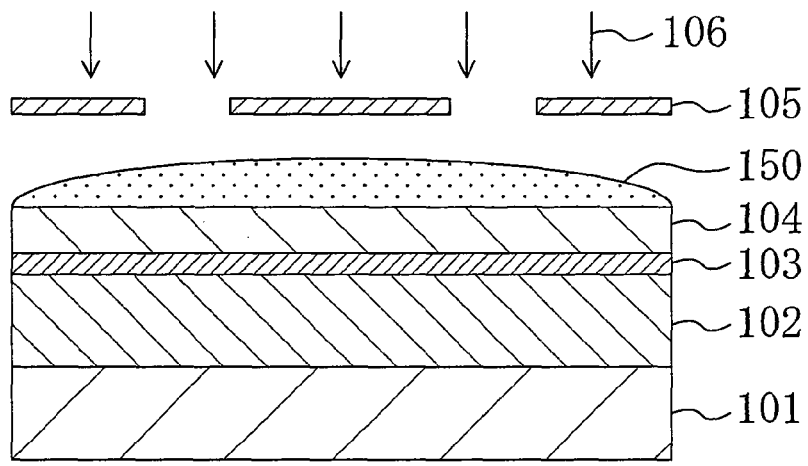
FIGS. 6A and 6B are cross-sectional views illustrating a modified example of the first embodiment of the present invention.
Figure 6B:
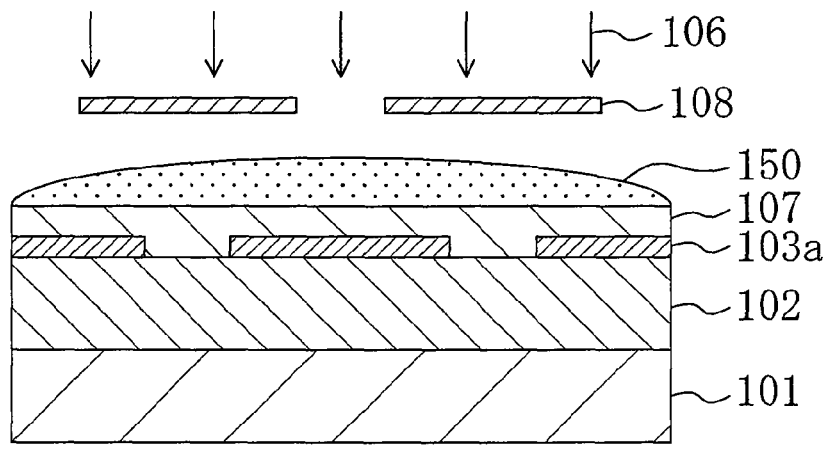

FIGS. 6A and 6B are cross-sectional views illustrating an example of application of the immersion exposure technique to double patterning described in the first embodiment. FIG. 6A is a cross-sectional view illustrating first resist exposure to which immersion exposure is applied. FIG. 6B is a cross-sectional view illustrating second resist exposure to which immersion exposure is applied.

FIG. 6A is a cross-sectional view illustrating first pattern exposure and corresponds to FIG. 2A. In this step, a liquid (immersion solution) 150 for immersion exposure, which is made of water, is provided on the first resist film 104 by, for example, a puddle method, and the first resist film 104 is irradiated with ArF excimer laser 106 through the first photomask 105, thereby performing first pattern exposure.

FIG. 6B is a cross-sectional view illustrating second pattern exposure and corresponds to FIG. 3B. In the same manner as in the step shown in FIG. 6A, the immersion liquid 150 of water is provided on the second resist film 107 by a puddle method, and the second resist film 107 is irradiated with ArF excimer laser 106 through the second photomask 108, thereby performing second pattern exposure.

As described above, the immersion exposure technique is applied and thus the immersion liquid (immersion solution) having a refraction index n fills between a lens in an exposure system and the resist film on the substrate. Accordingly, NA (the number of aperture) of the exposure system becomes n·NA, thus resulting in improvement of the resolution of the resist. Therefore, compared to the case where a normal exposure technique is used, a fine pattern having a better shape can be formed.

As the immersion liquid 150, for example, water, an acid solution or the like can be used. As an acid solution, for example, cesium sulfate aqueous solution, phosphate aqueous solution or the like may be used. The immersion liquid 150 may contain an additive such as a surfactant or the like.

With application of immersion exposure technique, as shown in FIGS. 6A and 6B, when the immersion liquid 150 is provided on the resist films 104 and 107, a resist component of the resist films 104 and 107 might dissolve into the immersion liquid 150 or the immersion liquid 150 might penetrate into the resist films 104 and 107. In either case, degradation of resolution is caused.

Figure 7A:
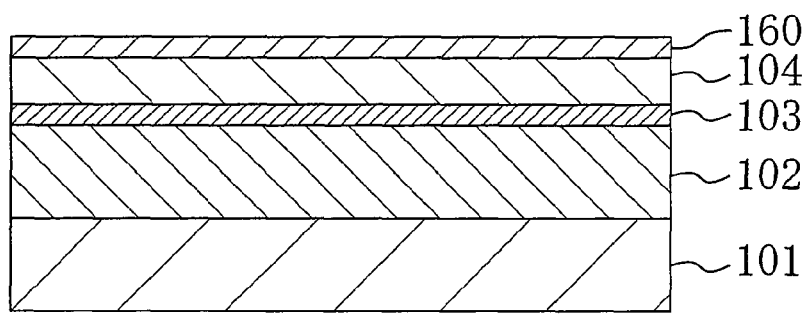
FIGS. 7A and 7B are cross-sectional views illustrating a modified example of the first embodiment of the present invention.
Figure 7B:
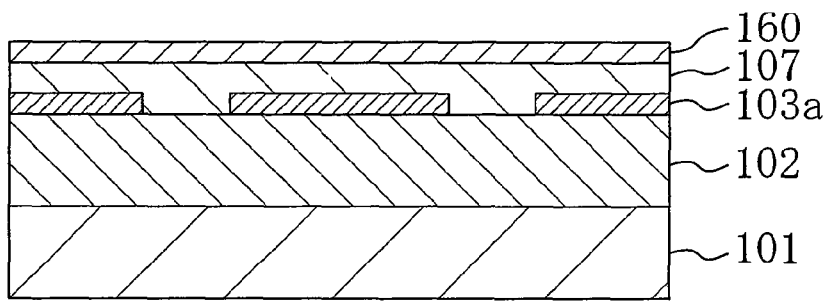
Figure 8A:
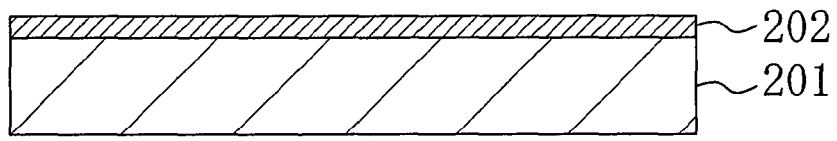
FIGS. 8A through 8D are cross-sectional views illustrating respective steps of a known pattern formation method using double patterning.
Figure 8B:
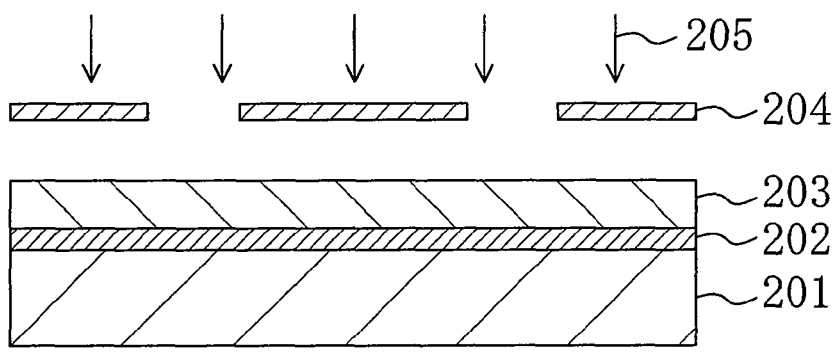
Figure 8C:
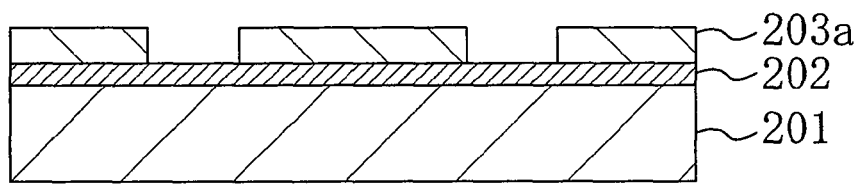
Figure 8D:
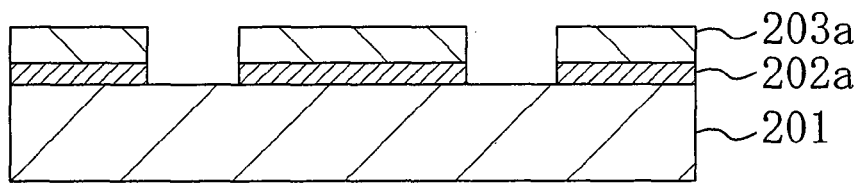
Figure 9A:
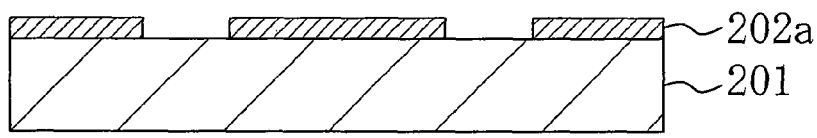
FIGS. 9A through 9D are cross-sectional views illustrating respective steps of a known pattern formation method using double patterning.
Figure 9B:
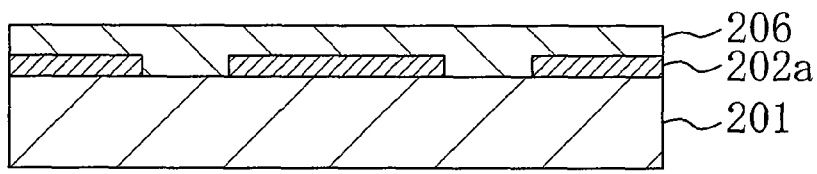
Figure 9C:
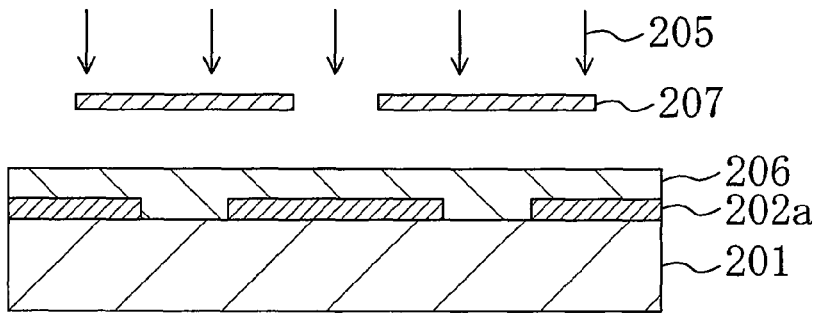
Figure 9D:
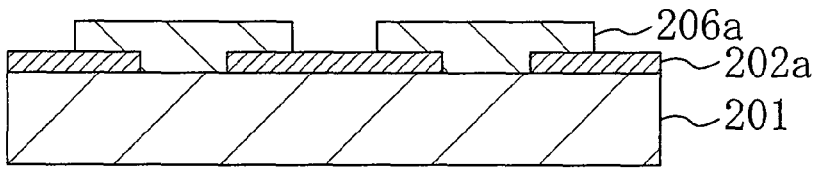
Figure 10A:
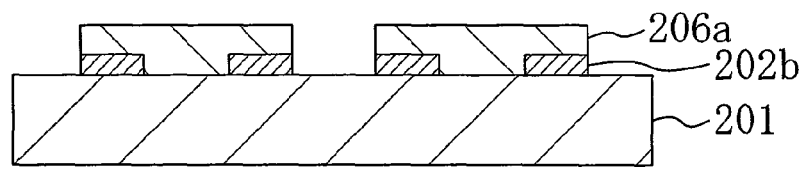
FIGS. 10A and 10B are cross-sectional views illustrating respective steps of a known pattern formation method using double patterning.
Figure 10B:
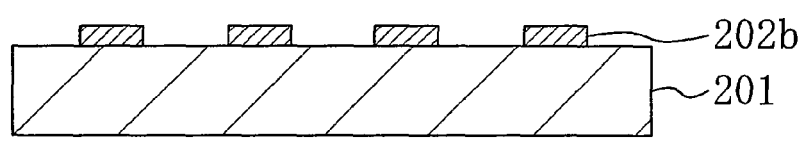
Figure 11:
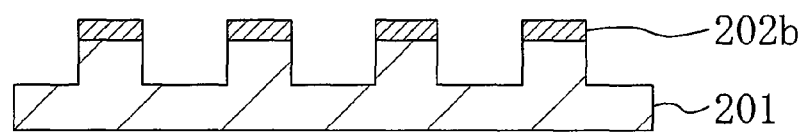
FIG. 11A is a cross-sectional view illustrating a step of etching a semiconductor substrate using a pattern formed by a known pattern formation method.
Figure 12A:
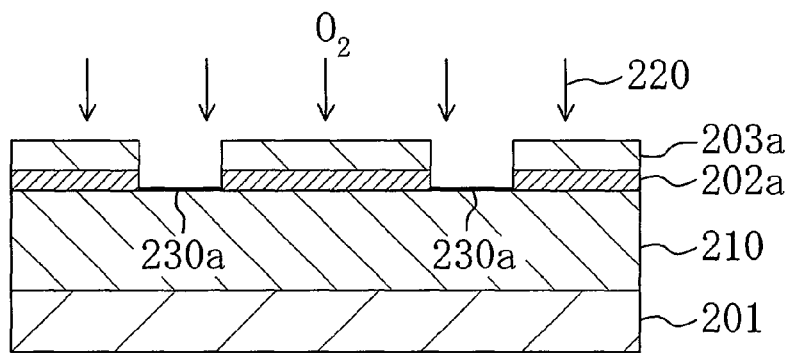
FIGS. 12A through 12D are cross-sectional view explaining problems in double patterning.
Figure 12B:
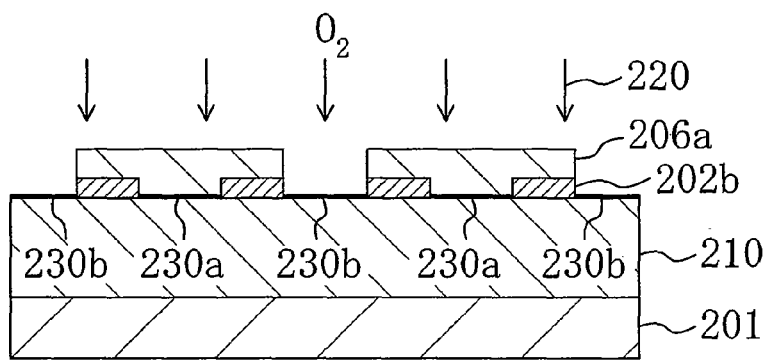
Figure 12C:
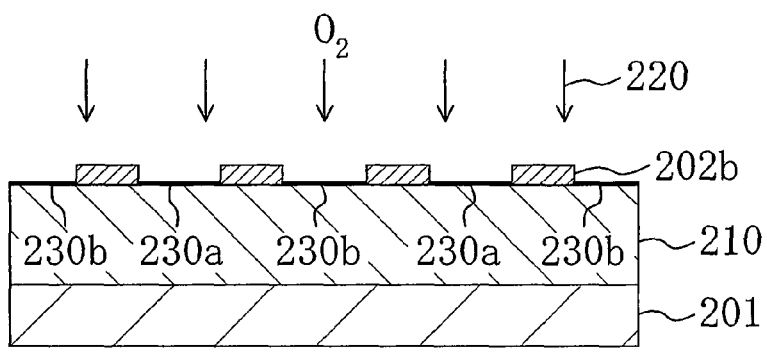
Figure 12D:
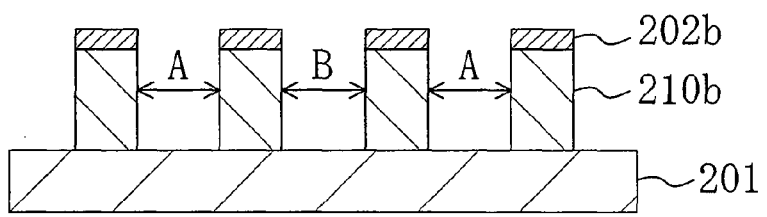

As a measure to cope with the above-described problems, as shown in FIGS. 7A and 7B, it is effective to form a barrier film 160 on the first resist film 104 and the second resist film 107. FIG. 7A is a cross-sectional view illustrating a step of forming a barrier film and corresponds to FIG. 1C. In FIG. 7A, the barrier film 160 is formed on the first resist film 104 so as to have a thickness of about 0.1 μm. Thereafter, immersion exposure shown in FIG. 6A is performed. FIG. 7B is a cross-sectional view illustrating a step of forming a barrier film and corresponds to FIG. 3A. In FIG. 7B, the barrier film 160 is formed on the second resist film 107 so as to have a thickness of about 0.1 μm. Thereafter, immersion exposure shown in FIG. 6B is performed.

As a barrier film, for example, an alkali-soluble material containing fluorine can be used. After formation of the barrier film 160, the barrier film 160 may be heated with a hot plate at a temperature of 120° C. for about 90 seconds to improve the denseness of the barrier film 160. If the denseness of the barrier film 160 is improved too much, it becomes difficult to remove the barrier film 160 by dissolution removal. Therefore, the barrier film 160 is preferably heated within an appropriate temperature range. The appropriate temperature range for heating the barrier film 160 is, for example, 100° C. to 150° C.

The above-described immersion exposure and formation of the barrier film 160 may be applied to both of first and second pattern exposures or one of the first and second pattern exposures.

Second Embodiment

In the first embodiment, variation in pattern dimension and the like due to exposure of the surface of the underlying layer film 102 to oxygen plasma are prevented from occurring by adding a fluorine-based surfactant to the underlying layer film 102. According to this embodiment, the same effects as those of the first embodiment are achieved by adding inorganic nano particles to the underlying layer film 102.

A pattern formation method according to this embodiment can be performed in the same manner as described in the first embodiment. The following description will be given with reference to FIGS. 1A through 1C, FIGS. 2A through 2D, FIGS. 3A through 3D and FIGS. 4A and 4B. Note that the same part as the description already given in the first embodiment will be omitted.

First, as shown in FIG. 1A, an underlying layer film 102 is formed on a semiconductor substrate 101 so as to have a thickness of 0.7 µm and then, as shown in FIG. 1B, an intermediate layer film 103 is formed on the underlying layer film 102 so as to have a thickness of about 0.08 µm. In this case, 8 wt % inorganic nano particles (of, for example, $SiO_2$, $HfO_2$ or the like) with a diameter of about 4 nm are added to the underlying layer film 102.

Next, as shown in FIG. 1C, a material for forming a first resist film is applied onto the intermediate layer film 103 to form a first resist film 104 having a thickness of about 0.15 µm.

Next, as shown in FIG. 2A, first pattern exposure is performed by irradiating the substrate with ArF excimer laser light 106 having NA of 0.85 through a first photomask 105 having a first pattern. After the first exposure, the first resist film 104 is heated with a hot plate at a temperature of 105° C. for 60 seconds (post-exposure baking).

Next, as shown FIG. 2B, the baked first resist film 104 is developed using a 2.38 wt % tetramethylammonium hydroxide solution (alkaline developer fluid), thereby forming a first resist pattern 104a of unexposed part of the first resist film 104.

Next, as shown in FIG. 2C, using the first resist pattern 104a as a mask, the intermediate layer film 103 is etched, for example, with fluorine-based gas, and then, as shown in FIG. 2D, the first resist pattern 104a is removed by ashing using oxygen plasma, thereby forming a first intermediate layer pattern 103a.

Next, as shown in FIG. 3A, a material for forming a second resist film is applied onto the first intermediate layer pattern 103a to form a second resist film 107 having a thickness of about 0.15 µm.

Next, as shown in FIG. 3B, second pattern exposure is performed by irradiating the substrate with the ArF excimer laser light 106 having NA of 0.85 through a second photomask 108 having a second pattern. After the second exposure, the second resist film 107 is heated with a hot plate at a temperature of 105° C. for 60 seconds (post exposure baking).

Next, as shown in FIG. 3C, the baked second resist film 107 is developed using a 2.38 wt % tetramethylammonium hydroxide solution (alkaline developer fluid), thereby forming a second resist pattern 107a of unexposed part of the second resist film 107.

Next, as shown in FIG. 3D, using the second resist pattern 107a as a mask, the first intermediate layer pattern 103a is etched, for example, with fluorine-based gas, and then, as shown in FIG. 4A, the second resist pattern 107a is removed by ashing using oxygen plasma, thereby forming a second intermediate layer pattern 103b.

Lastly, as shown in FIG. 4B, using the second intermediate layer pattern 103b as a mask, the underlying layer film 102 is etched with oxygen-based gas, thereby forming a lower layer film pattern 102b having the first and the second patterns.

In the pattern formation method of this embodiment, when the first resist pattern 104a and the second resist pattern 107a formed by the two pattern exposure processes are removed by ashing, part of the surface of the underlying layer film 102 on which the second intermediate layer pattern 103b is not formed is exposed to oxygen plasma. However, the underlying layer film 102 is provided with oxygen-based plasma resistance by adding inorganic nano particles thereto and thus, even when the underlying layer film 102 is etched using the second intermediate layer pattern 103b as a mask, problems such as variation in pattern dimension, shift of pattern dimension and the like do not arise. Moreover, with inorganic nano particles dispersed in the underlying layer film 102, etching of the underlying layer film 102 is not inhibited and the lower layer film pattern 102b having a good shape can be formed.

The additive amount of inorganic nano particles contained in the underlying layer film 102 is preferably in a range of 2 to 30 wt %, and more particularly in a range of 5 to 20 wt %. If the additive amount is smaller than 5 wt %, sufficient resistance against oxygen-based plasma can not be achieved. If the additive amount is larger than 20 wt %, etching of the underlying layer film 102 might be inhibited. Note that in the present invention, "nano particles" refers to particulate aggregates generally having a size of 10 nm or less.

According to this embodiment, as a matter of course, the immersion exposure and/or formation of the barrier film described in the modified embodiment of the first embodiment may be applied to the first pattern exposure and/or the second pattern exposure.

The present invention has been described with reference to preferred embodiments of the present invention. However, the present invention is not limited to the above-described embodiments and various modifications are possible. For example, in the above-described embodiments, resist exposure is performed using ArF excimer laser light, but the present invention is not limited thereto. For example, KrF excimer laser light, $Xe_2$ laser light, $F_2$ laser light, KrAr laser light, $Ar_2$ laser light and the like may be used.

What is claimed is:

1. A pattern formation method comprising the steps of:
   a) forming an underlying layer film on a substrate;
   b) forming an intermediate layer film on the underlying layer film;
   c) forming a first resist film on the intermediate layer film and then performing exposure and development to the first resist film through a first photomask having a first pattern, thereby forming a first resist pattern;
   d) etching the intermediate film using the first resist pattern as a mask, thereby forming a first intermediate layer pattern;
   e) removing the first resist pattern;
   f) forming, after the step e), a second resist film on the underlying layer film and the first intermediate layer pattern, and then performing exposure and development to the second resist film through a second photomask having a second pattern, thereby forming a second resist pattern;
   g) etching the first intermediate layer pattern using the second resist pattern as a mask, thereby forming a second intermediate layer pattern;
   h) removing the second resist pattern; and
   i) etching, after the step h), the underlying layer film using the second intermediate layer pattern as a mask, thereby forming an underlying layer pattern including the first and second patterns,
   wherein the underlying layer film is formed of an organic material having a resistance against oxygen-based plasma, in the step e), the first resist pattern is removed by ashing with oxygen-based plasma, and the underlying layer film is formed of an organic material to which a fluorine-based surfactant is added.

2. The pattern formation method of claim 1, wherein the fluorine-based surfactant locally concentrates around a surface of the underlying layer film.

3. The pattern formation method of claim 1, wherein 10 to 30 wt % of the fluorine-based surfactant is added to the underlying layer film.

4. The pattern formation method of claim 1, wherein the fluorine-based surfactant is an anionic fluorine-based or nonionic fluorine-based surfactant.

5. The pattern formation method of claim 4, wherein the anionic fluorine-based surfactant is formed of one or more materials selected from the group consisting of perfluoroalkyl group-containing sulfonate, perfluoroalkyl group-containing carboxylate and perfluoroalkyl group-containing ester phosphate.

6. The pattern formation method of claim 4, wherein the nonionic fluorine-based surfactant is formed of perfluoroalkyl ethylene oxide adduct.

7. The pattern formation method of claim 1, wherein exposure in the step c) or the step f) is performed using KrF excimer laser light, $Xe_2$ laser light, ArF excimer laser light, $F_2$ laser light, KrAr laser light or $Ar_2$ laser light.

8. A pattern formation method comprising the steps of:
a) forming an underlying layer film on a substrate;
b) forming an intermediate layer film on the underlying layer film;
c) forming a first resist film on the intermediate layer film and then performing exposure and development to the first resist film through a first photomask having a first pattern, thereby forming a first resist pattern;
d) etching the intermediate film using the first resist pattern as a mask, thereby forming a first intermediate layer pattern;
e) removing the first resist pattern;
f) forming, after the step e), a second resist film on the underlying layer film and the first intermediate layer pattern, and then performing exposure and development to the second resist film through a second photomask having a second pattern, thereby forming a second resist pattern;
g) etching the first intermediate layer pattern using the second resist pattern as a mask, thereby forming a second intermediate layer pattern;
h) removing the second resist pattern; and
i) etching, after the step h), the underlying layer film using the second intermediate layer pattern as a mask, thereby forming an underlying layer pattern including the first and second patterns,
wherein the underlying layer film is formed of an organic material having a resistance against oxygen-based plasma,
in the step e), the first resist pattern is removed by ashing with oxygen-based plasma, and
the underlying layer film is formed of an organic material to which inorganic nano particles are added.

9. The pattern formation method of claim 8, wherein 5 to 20 wt % of the inorganic nano particles are added to the underlying layer film.

10. The pattern formation method of claim 8, wherein the inorganic nano particles are $SiO_2$ or $HfO_2$ nano particles.

11. The pattern formation method of claim 8, wherein exposure in the step c) or the step f) is performed using KrF excimer laser light, $Xe_2$ laser light, ArF excimer laser light, $F_2$ laser light, KrAr laser light or $Ar_2$ laser light.

12. A pattern formation method comprising the steps of:
a) forming an underlying layer film on a substrate;
b) forming an intermediate layer film on the underlying layer film;
c) forming a first resist film on the intermediate layer film and then performing exposure and development to the first resist film through a first photomask having a first pattern, thereby forming a first resist pattern;
d) etching the intermediate film using the first resist pattern as a mask, thereby forming a first intermediate layer pattern;
e) removing the first resist pattern;
f) forming, after the step e), a second resist film on the underlying layer film and the first intermediate layer pattern, and then performing exposure and development to the second resist film through a second photomask having a second pattern, thereby forming a second resist pattern;
g) etching the first intermediate layer pattern using the second resist pattern as a mask, thereby forming a second intermediate layer pattern;
h) removing the second resist pattern; and
i) etching, after the step h), the underlying layer film using the second intermediate layer pattern as a mask, thereby forming an underlying layer pattern including the first and second patterns,
wherein the underlying layer film is formed of an organic material having a resistance against oxygen-based plasma,
in the step e), the first resist pattern s removed by ashing with oxygen-based plasma,
in at least one of the step c) and the step f), immersion exposure is performed with a liquid provided on the first resist film or the second resist film.

13. The pattern formation method of claim 12, further comprising, before performing the immersion exposure, the step of forming a barrier film on the first resist film or the second resist film.

14. The pattern formation method of claim 13, further comprising, after forming the barrier film, the step of heating the barrier film.

15. The pattern formation method of claim 13, wherein polymer forming the barrier film is polyvinyl alcohol, polyacrylic acid or polyvinyl hexafluoroisopropyl alcohol.

16. The pattern formation method of claim 12, wherein the liquid is water or an acid solution.

17. The pattern formation method of claim 16, wherein the acid solution is a cesium sulfate aqueous solution or a phosphate aqueous solution.

18. The pattern formation method of claim 12, wherein exposure in the step c) or the step f) is performed using KrF excimer laser light, $Xe_2$ laser light, ArF excimer laser light, $F_2$ laser light, KrAr laser light or $Ar_2$ laser light.

* * * * *